(12) United States Patent
Roohparvar

(10) Patent No.: US 7,701,763 B2
(45) Date of Patent: Apr. 20, 2010

(54) LEAKAGE COMPENSATION DURING PROGRAM AND READ OPERATIONS

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 163 days.

(21) Appl. No.: 12/108,148

(22) Filed: Apr. 23, 2008

(65) Prior Publication Data

US 2009/0268520 A1 Oct. 29, 2009

(51) Int. Cl.
*F11C 16/06* (2006.01)
(52) U.S. Cl. .............................. 365/185.09; 365/185.17; 365/189.06
(58) Field of Classification Search ............ 365/185.09, 365/185.17, 185.22, 185.23, 185.24, 185.25
See application file for complete search history.

(56) References Cited

U.S. PATENT DOCUMENTS

| 7,062,619 | B2 * | 6/2006 | Dvir et al. ................... 711/154 |
| 7,369,438 | B2 * | 5/2008 | Lee ........................ 365/185.17 |
| 2006/0138245 | A1 * | 6/2006 | Lee ............................. 235/492 |
| 2008/0303527 | A1 * | 12/2008 | Fechalos et al. ............. 324/426 |

* cited by examiner

*Primary Examiner*—Gene N. Auduong
(74) *Attorney, Agent, or Firm*—Leffert Jay & Polglaze, P.A.

(57) ABSTRACT

Methods of operating a memory and a memory are disclosed, such as an analog non-volatile memory device and process that reduces the effects of charge leakage from data cache capacitors, maintaining stored charge levels as data. In one embodiment, data values are compensated for leakage that is uniform across the data cache by charging a reference capacitor or initiating another leakage model and uniformly adjusting the ground of the data capacitors by the effect amount or by adjusting an amplifier offset or gain. In another embodiment, held data values are compensated for charge leakage effects that are non-uniform due to data values being sequentially transferred into the data cache by scaling a ground node or adjustment of amplifier offset/gain of each capacitor in the data cache against the leakage reference and the order in which data was transferred into the data cache.

25 Claims, 10 Drawing Sheets

LEAKAGE COMPENSATION DURING PROGRAM AND READ OPERATIONS

TECHNICAL FIELD

The present disclosure relates generally to semiconductor memory, and in particular, the present disclosure relates to solid state non-volatile memory devices and systems utilizing analog signals to communicate data values of two or more bits of information.

BACKGROUND

Electronic devices commonly have some type of bulk storage device available to them. A common example is a hard disk drive (HDD). HDDs are capable of large amounts of storage at relatively low cost, with current consumer HDDs available with over one terabyte of capacity.

HDDs generally store data on rotating magnetic media or platters. Data is typically stored as a pattern of magnetic flux reversals on the platters. To write data to a typical HDD, the platter is rotated at high speed while a write head floating above the platter generates a series of magnetic pulses to align magnetic particles on the platter to represent the data. To read data from a typical HDD, resistance changes are induced in a magnetoresistive read head as it floats above the platter rotated at high speed. In practice, the resulting data signal is an analog signal whose peaks and valleys are the result of the magnetic flux reversals of the data pattern. Digital signal processing techniques called partial response maximum likelihood (PRML) are then used to sample the analog data signal to determine the likely data pattern responsible for generating the data signal.

HDDs have certain drawbacks due to their mechanical nature. HDDs are susceptible to damage or excessive read/write errors due to shock, vibration or strong magnetic fields. In addition, they are relatively large users of power in portable electronic devices.

Another example of a bulk storage device is a solid state drive (SSD). Instead of storing data on rotating media, SSDs utilize semiconductor memory devices to store their data, but include an interface and form factor making them appear to their host system as if they are a typical HDD. The memory devices of SSDs are typically non-volatile flash memory devices.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

Unlike HDDs, the operation of SSDs is generally not subject to vibration, shock or magnetic field concerns due to their solid state nature. Similarly, without moving parts, SSDs have lower power requirements than HDDs. However, SSDs currently have much lower storage capacities compared to HDDs of the same form factor and a significantly higher cost per bit.

For the reasons stated above, and for other reasons which will become apparent to those skilled in the art upon reading and understanding the present specification, there is a need in the art for alternative bulk storage options.

DETAILED DESCRIPTION

Figure 1:
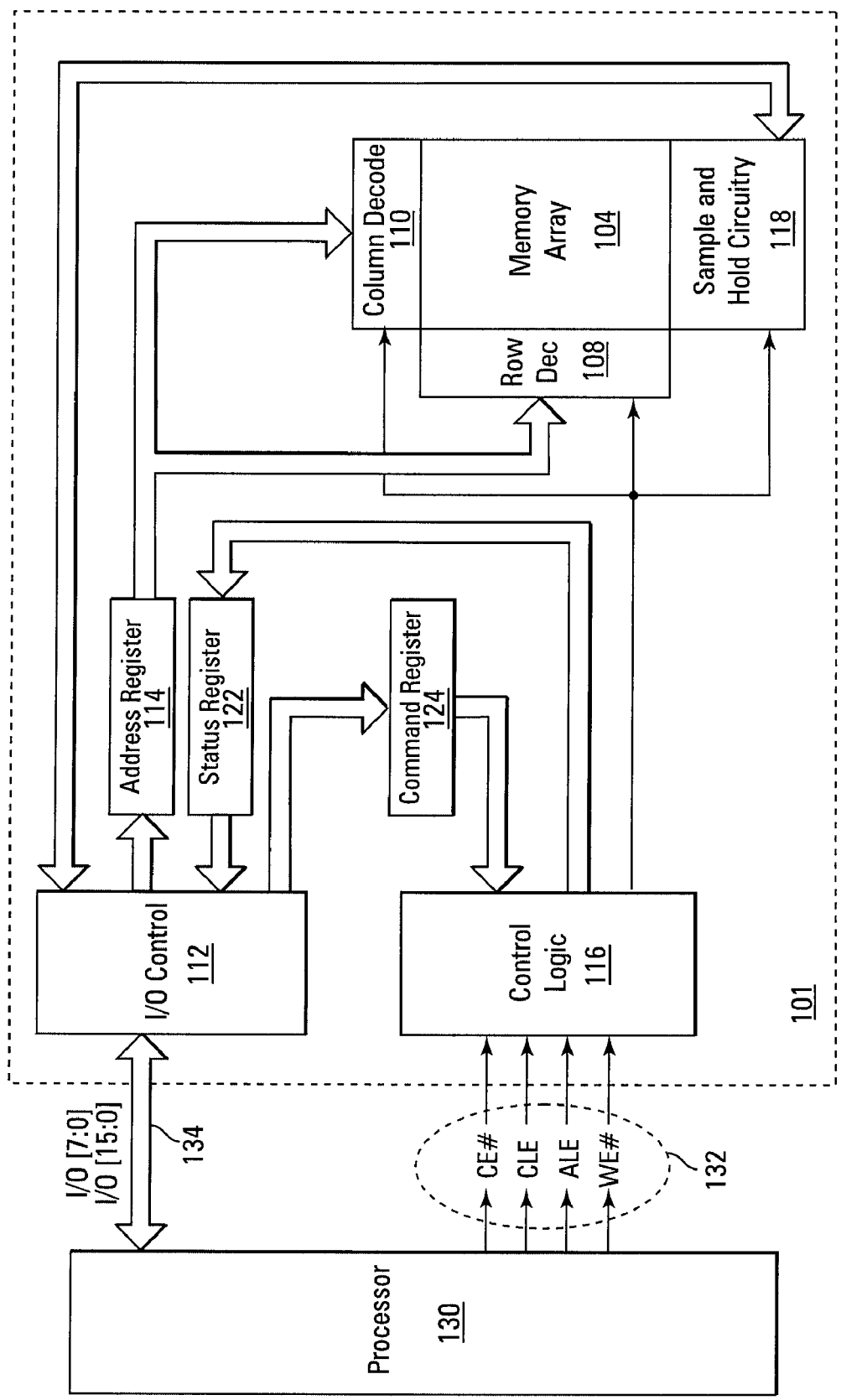
FIG. 1 is a simplified block diagram of a memory device according to an embodiment of the disclosure.

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Traditional solid-state memory devices pass data in the form of binary signals. Typically, a ground potential represents a first logic level of a bit of data, e.g., a '0' data value, while a supply potential represents a second logic level of a bit of data, e.g., a '1' data value. A multi-level cell (MLC) may be assigned, for example, four different threshold voltage (Vt) ranges of 200 mV for each range, with each range corresponding to a distinct data state, thereby representing four data values or bit patterns. Typically, a dead space or margin of 0.2V to 0.4V is between each range to keep the Vt distributions from overlapping. If the Vt of the cell is within the first range, the cell may be deemed to store a logical 11 state and is typically considered the erased state of the cell. If the Vt is within the second range, the cell may be deemed to store a logical 10 state. If the Vt is within the third range, the cell may be deemed to store a logical 00 state. And if the Vt is within the fourth range, the cell may be deemed to store a logical 01 state.

When programming a traditional MLC device as described above, cells are generally first erased, as a block, to correspond to the erased state. Following erasure of a block of cells, the least-significant bit (LSB) of each cell is first programmed, if necessary. For example, if the LSB is a 1, then no programming is necessary, but if the LSB is a 0, then the Vt of the target memory cell is moved from the Vt range corresponding to the 11 logic state to the Vt range corresponding to the 10 logic state. Following programming of the LSBs, the most-significant bit (MSB) of each cell is programmed in a similar manner, shifting the Vt where necessary. When reading an MLC of a traditional memory device, one or more read operations determine generally into which of the ranges the Vt of the cell voltage falls. For example, a first read operation may determine whether the Vt of the target memory cell is indicative of the MSB being a 1 or a 0 while a second read operation may determine whether the Vt of the target memory cell in indicative of the LSB being a 1 or a 0. In each case, however, a single bit is returned from a read operation of a target memory cell, regardless of how many bits are stored on each cell. This problem of multiple program and read operations becomes increasingly troublesome as more bits are stored on each MLC. Because each such program or read operation is a binary operation, i.e., each programs or returns a single bit of information per cell, storing more bits on each MLC leads to longer operation times.

The memory devices of an illustrative embodiment store data as Vt ranges on the memory cells. In contrast to traditional memory devices, however, program and read operations are capable of utilizing data signals not as discrete bits of MLC data values, but as full representations of MLC data values, such as their complete bit patterns. For example, in a two-bit MLC device, instead of programming a cell's LSB and subsequently programming that cell's MSB, a target threshold voltage may be programmed representing the bit pattern of those two bits. That is, a series of program and verify operations would be applied to a memory cell until that memory cell obtained its target threshold voltage rather than programming to a first threshold voltage for a first bit, shifting to a second threshold voltage for a second bit, etc. Similarly, instead of utilizing multiple read operations to determine each bit stored on a cell, the threshold voltage of the cell may be determined and passed as a single signal representing the complete data value or bit pattern of the cell. The memory devices of the various embodiments do not merely look to whether a memory cell has a threshold voltage above or below some nominal threshold voltage as is done in traditional memory devices. Instead, a voltage signal is generated that is representative of the actual threshold voltage of that memory cell across the continuum of possible threshold voltages. An advantage of this approach becomes more significant as the bits per cell count is increased. For example, if the memory cell were to store eight bits of information, a single read operation would return a single analog data signal representative of eight bits of information.

FIG. 1 is a simplified block diagram of a memory device 101 according to an embodiment of the disclosure. Memory device 101 includes an array of memory cells 104 arranged in rows and columns. Although the various embodiments will be described primarily with reference to NAND memory arrays, the various embodiments are not limited to a specific architecture of the memory array 104. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 108 and a column decode circuitry 110 are provided to decode address signals provided to the memory device 101. Address signals are received and decoded to access memory array 104. Memory device 101 also includes input/output (I/O) control circuitry 112 to manage input of commands, addresses and data to the memory device 101 as well as output of data and status information from the memory device 101. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a sample and hold circuitry 118. The sample and hold circuitry 118 latches data, either incoming or outgoing, in the form of analog voltage levels. For example, the sample and hold circuitry could contain capacitors or other analog storage devices for sampling either an incoming voltage signal representing data to be written to a memory cell or an outgoing voltage signal indicative of the threshold voltage sensed from a memory cell. The sample and hold circuitry 118 may further provide for amplification and/or buffering of the sampled voltage to provide a stronger data signal to an external device.

The handling of analog voltage signals may take an approach similar to an approach well known in the area of CMOS imager technology, where charge levels generated at pixels of the imager in response to incident illumination are stored on capacitors. These charge levels are then converted to voltage signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a voltage level indicative of an actual or target threshold voltage of a memory cell for reading or programming, respectively, the memory cell. This charge could then be converted to an analog voltage using a differential amplifier having a grounded input or other reference signal as a second input. The output of the differential amplifier could then be passed to the I/O control circuitry 112 for output from the memory device, in the case of a read operation, or used for comparison during one or more verify operations in programming the memory device. It is noted that the I/O control circuitry 112 could optionally include analog-to-digital conversion functionality and digital-to-analog conversion (DAC) functionality to convert read data from an analog signal to a digital bit pattern and to convert write data from a digital bit pattern to an analog signal such that the memory device 101 could be adapted for communication with either an analog or digital data interface.

During a write operation, target memory cells of the memory array 104 are programmed until voltages indicative of their Vt levels match the levels held in the sample and hold circuitry 118. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 118 for transfer to an external processor (not shown in FIG. 1) either directly as analog signals or as digitized representations of the analog signals depending upon whether ADC/DAC functionality is provided external to, or within, the memory device.

Threshold voltages of cells may be determined in a variety of manners. For example, a word line voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 118 may include caching, i.e., multiple storage locations for each data value, such that the memory device 101 may be reading a next data value while passing a first data value to the external processor, or receiving a next data value while writing a first data value to the memory array 104. A status register 122 is coupled between I/O control circuitry 112 and control logic 116 to latch the status information for output to the external processor.

Memory device 101 receives control signals at control logic 116 over a control link 132. The control signals may include a chip enable CE#, a command latch enable CLE, an address latch enable ALE, and a write enable WE#. Memory device 101 may receive commands (in the form of command signals), addresses (in the form of address signals), and data (in the form of data signals) from an external processor over a multiplexed input/output (I/O) bus 134 and output data to the external processor over I/O bus 134.

In a specific example, commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data may be received over input/output (I/O) pins [7:0] for a device capable of receiving eight parallel signals, or input/output (I/O) pins [15:0] for a device capable of receiving sixteen parallel signals, at I/O control circuitry 112 and are transferred to sample and hold circuitry 118. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 1 has been simplified to help focus on the embodiments of the disclosure. Additionally, while the memory device of FIG. 1 has been described in accordance with popular conventions for receipt and output of the various signals, it is noted that the various embodiments are not limited by the specific signals and I/O configurations described unless expressly noted herein. For example, command and address signals could be received at inputs separate from those receiving the data signals, or data signals could be transmitted serially over a single I/O line of I/O bus 134. Because the data signals represent bit patterns instead of individual bits, serial communication of an 8-bit data signal could be as efficient as parallel communication of eight signals representing individual bits.

Figure 2:
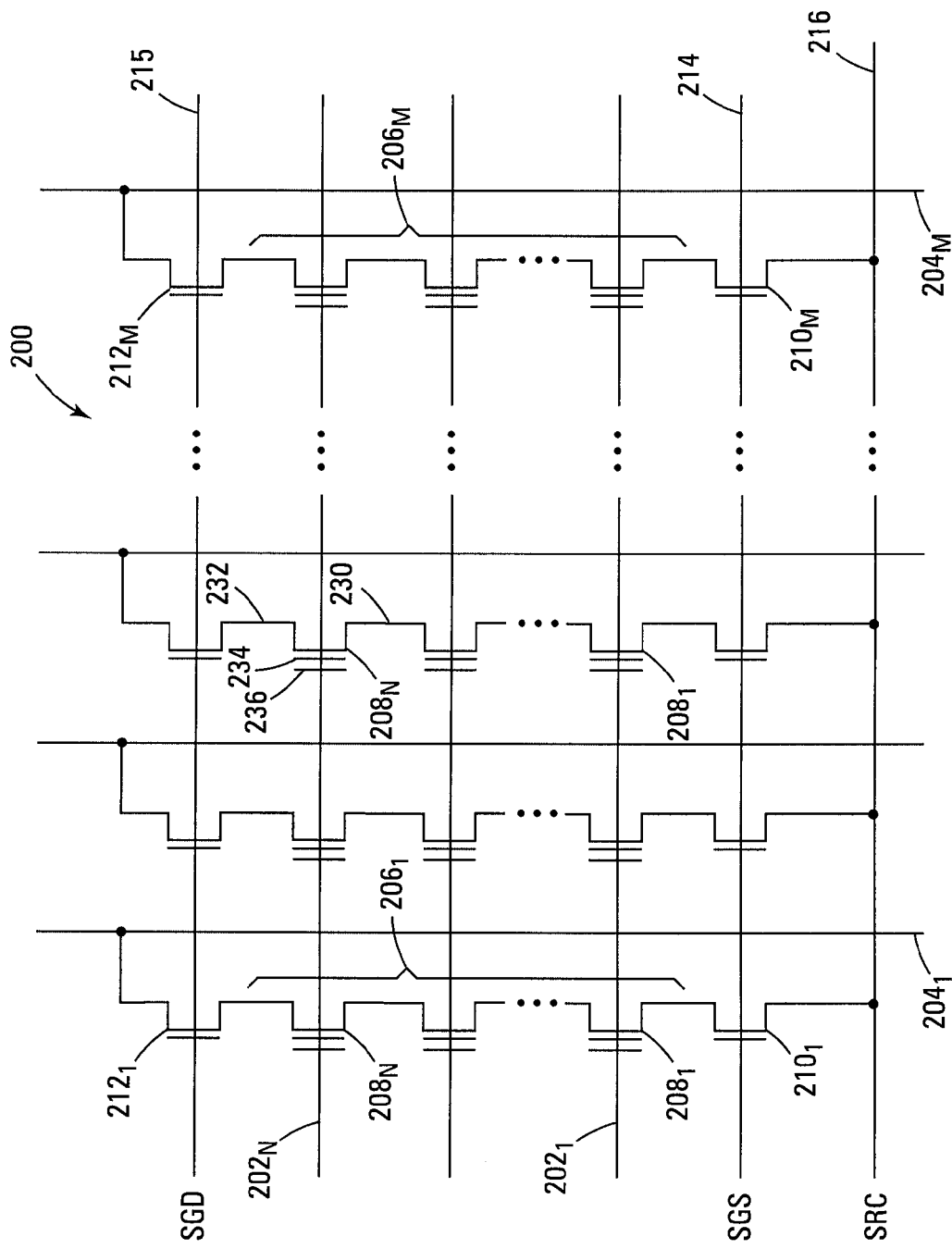
FIG. 2 is a schematic of a portion of an example NAND memory array as might be found in the memory device of FIG. 1.

FIG. 2 is a schematic of a portion of an example NAND memory array 200 as might be found in the memory array 104 of FIG. 1. As shown in FIG. 2, the memory array 200 includes word lines $202_1$ to $202_N$ and intersecting bit lines $204_1$ to $204_M$. For ease of addressing in the digital environment, the number of word lines 202 and the number of bit lines 204 are generally each some power of two.

Memory array 200 includes NAND strings $206_1$ to $206_M$. Each NAND string includes transistors $208_1$ to $208_N$, each located at an intersection of a word line 202 and a bit line 204. The transistors 208, depicted as floating-gate transistors in FIG. 2, represent non-volatile memory cells for storage of data. The floating-gate transistors 208 of each NAND string 206 are connected in series source to drain between one or more source select gates 210, e.g., a field-effect transistor (FET), and one or more drain select gates 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a local bit line 204 for the corresponding NAND string at a drain contact. For example, the drain of drain select gate $212_1$ is connected to the local bit line $204_1$ for the corresponding NAND string $206_1$ at a drain contact. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$. If multiple drain select gates 212 are utilized for a given NAND string 206, they would be coupled in series between the corresponding bit line 204 and the last floating-gate transistor $208_N$ of that NAND string 206.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202. Other forms of transistors 208 may also be utilized with embodiments of the disclosure, such as NROM, magnetic or ferroelectric transistors and other transistors capable of being programmed to assume one of two or more threshold voltage ranges.

Memory devices of the various embodiments may be advantageously used in bulk storage devices. For various embodiments, these bulk storage devices may take on the same form factor and communication bus interface of traditional HDDs, thus allowing them to replace such drives in a variety of applications. Some common form factors for HDDs include the 3.5", 2.5" and PCMCIA (Personal Computer Memory Card International Association) form factors commonly used with current personal computers and larger digital media recorders, as well as 1.8" and 1" form factors commonly used in smaller personal appliances, such as mobile telephones, personal digital assistants (PDAs) and digital media players. Some common bus interfaces include universal serial bus (USB), AT attachment interface (ATA)

Figure 3:
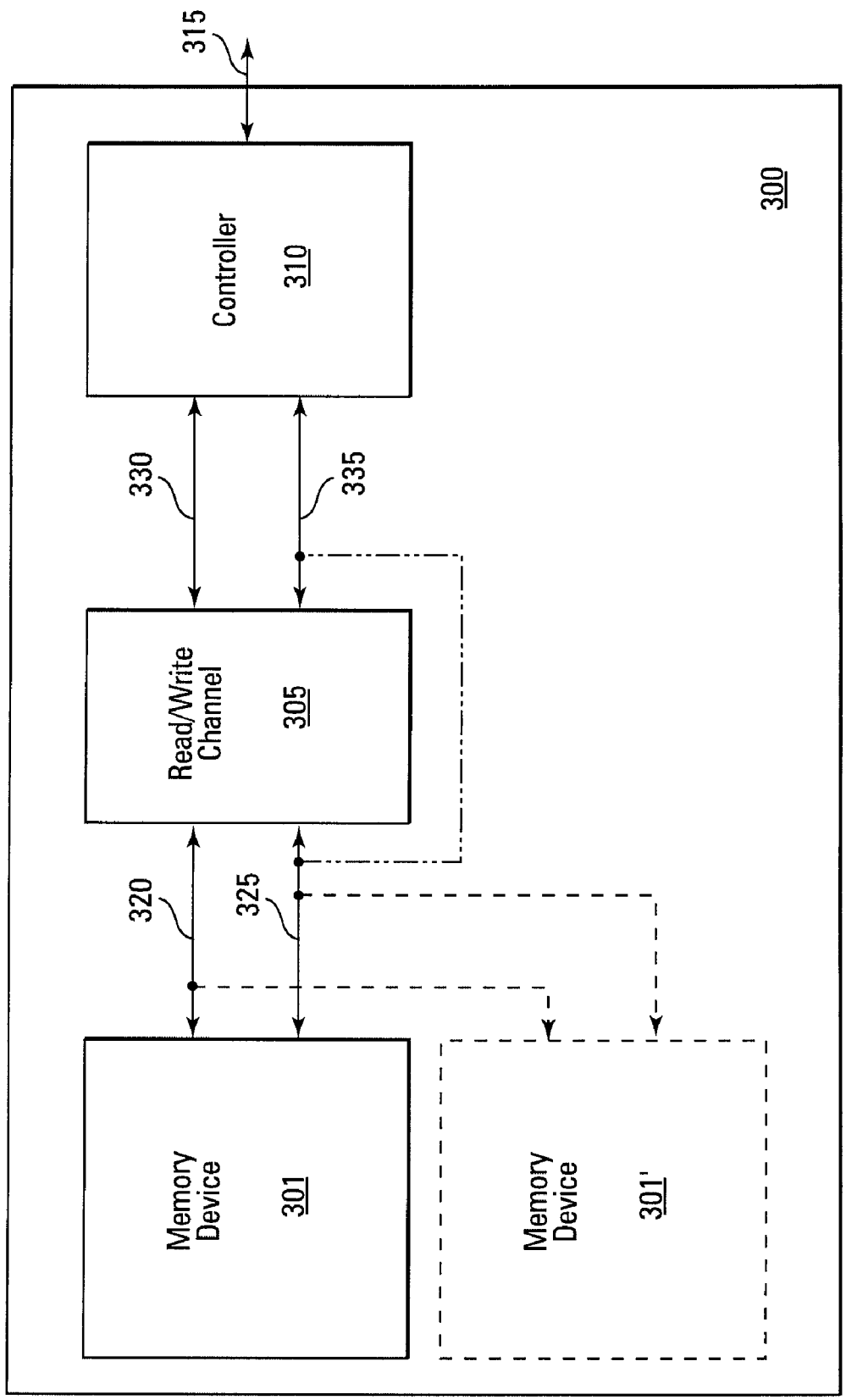
FIG. 3 is a block schematic of a solid state bulk storage device in accordance with one embodiment of the present disclosure.

[also known as integrated drive electronics or IDE], serial ATA (SATA), small computer systems interface (SCSI) and the Institute of Electrical and Electronics Engineers (IEEE) 1394 standard. While a variety of form factors and communication interfaces were listed, the embodiments are not limited to a specific form factor or communication standard. Furthermore, the embodiments need not conform to a HDD form factor or communication interface. FIG. 3 is a block schematic of a solid state bulk storage device 300 in accordance with one embodiment of the present disclosure.

The bulk storage device 300 includes a memory device 301 in accordance with an embodiment of the disclosure, a read/write channel 305 and a controller 310. The read/write channel 305 provides for analog-to-digital conversion of data signals received from the memory device 301 as well as digital-to-analog conversion of data signals received from the controller 310. The controller 310 provides for communication between the bulk storage device 300 and an external processor (not shown in FIG. 3) through bus interface 315. It is noted that the read/write channel 305 could service one or more additional memory devices, as depicted by memory device 301' in dashed lines. Selection of a single memory device 301 for communication can be handled through a multi-bit chip enable signal or other multiplexing scheme.

The memory device 301 is coupled to a read/write channel 305 through an analog interface 320 and a digital interface 325. The analog interface 320 provides for the passage of analog data signals between the memory device 301 and the read/write channel 305 while the digital interface 325 provides for the passage of control signals, command signals and address signals from the read/write channel 305 to the memory device 301. The digital interface 325 may further provide for the passage of status signals from the memory device 301 to the read/write channel 305. The analog interface 320 and the digital interface 325 may share signal lines as noted with respect to the memory device 101 of FIG. 1. Although the embodiment of FIG. 3 depicts a dual analog/digital interface to the memory device, functionality of the read/write channel 305 could optionally be incorporated into the memory device 301 as discussed with respect to FIG. 1 such that the memory device 301 communicates directly with the controller 310 using only a digital interface for passage of control signals, command signals, status signals, address signals and data signals.

The read/write channel 305 is coupled to the controller 310 through one or more interfaces, such as a data interface 330 and a control interface 335. The data interface 330 provides for the passage of digital data signals between the read/write channel 305 and the controller 310. The control interface 335 provides for the passage of control signals, command signals and address signals from the controller 310 to the read/write channel 305. The control interface 335 may further provide for the passage of status signals from the read/write channel 305 to the controller 310. Status and command/control signals may also be passed directly between the controller 310 and the memory device 301 as depicted by the dashed line connecting the control interface 335 to the digital interface 325.

Although depicted as two distinct devices in FIG. 3, the functionality of the read/write channel 305 and the controller 310 could alternatively be performed by a single integrated circuit device. And while maintaining the memory device 301 as a separate device would provide more flexibility in adapting the embodiments to different form factors and communication interfaces, because it is also an integrated circuit device, the entire bulk storage device 300 could be fabricated as a single integrated circuit device.

The read/write channel 305 is a signal processor adapted to at least provide for conversion of a digital data stream to an analog data stream and vice versa. A digital data stream provides data signals in the form of binary voltage levels, i.e., a first voltage level indicative of a bit having a first binary data value, e.g., 0, and a second voltage level indicative of a bit having a second binary data value, e.g., 1. An analog data stream provides data signals in the form of analog voltages having more than two levels, with different voltage levels or ranges corresponding to different bit patterns of two or more bits. For example, in a system adapted to store two bits per memory cell, a first voltage level or range of voltage levels of an analog data stream could correspond to a bit pattern of 11, a second voltage level or range of voltage levels of an analog data stream could correspond to a bit pattern of 10, a third voltage level or range of voltage levels of an analog data stream could correspond to a bit pattern of 00 and a fourth voltage level or range of voltage levels of an analog data stream could correspond to a bit pattern of 01. Thus, one analog data signal in accordance with the various embodiments would be converted to two or more digital data signals, and vice versa.

In practice, control and command signals are received at the bus interface 315 for access of the memory device 301 through the controller 310. Addresses and data values may also be received at the bus interface 315 depending upon what type of access is desired, e.g., write, read, format, etc. In a shared bus system, the bus interface 315 would be coupled to a bus along with a variety of other devices. To direct communications to a specific device, an identification value may be placed on the bus indicating which device on the bus is to act upon a subsequent command. If the identification value matches the value taken on by the bulk storage device 300, the controller 310 would then accept the subsequent command at the bus interface 315. If the identification value did not match, the controller 310 would ignore the subsequent communication. Similarly, to avoid collisions on the bus, the various devices on a shared bus may instruct other devices to cease outbound communication while they individually take control of the bus. Protocols for bus sharing and collision avoidance are well known and will not be detailed herein. The controller 310 then passes the command, address and data signals on to the read/write channel 305 for processing. Note that the command, address and data signals passed from the controller 310 to the read/write channel 305 need not be the same signals received at the bus interface 315. For example, the communication standard for the bus interface 315 may differ from the communication standard of the read/write channel 305 or the memory device 301. In this situation, the controller 310 may translate the commands and/or addressing scheme prior to accessing the memory device 301. In addition, the controller 310 may provide for load leveling within the one or more memory devices 301, such that physical addresses of the memory devices 301 may change over time for a given logical address. Thus, the controller 310 would map the logical address from the external device to a physical address of a target memory device 301.

For write requests, in addition to the command and address signals, the controller 310 would pass digital data signals to the read/write channel 305. For example, for a 16-bit data word, the controller 310 would pass 16 individual signals having a first or second binary logic level. The read/write channel 305 would then convert the digital data signals to an analog data signal representative of the bit pattern of the digital data signals. To continue with the foregoing example, the read/write channel 305 would use a digital-to-analog conversion to convert the 16 individual digital data signals to a single analog signal having a potential level indicative of the desired 16-bit data pattern. For one embodiment, the analog data signal representative of the bit pattern of the digital data signals is indicative of a desired threshold voltage of the target memory cell. However, in programming of a one-transistor memory cells, it is often the case that programming of neighboring memory cells will increase the threshold voltage of previously programmed memory cells. Thus, for another embodiment, the read/write channel 305 can take into account these types of expected changes in the threshold voltage, and adjust the analog data signal to be indicative of a threshold voltage lower than the final desired threshold voltage. After conversion of the digital data signals from the controller 310, the read/write channel 305 would then pass the write command and address signals to the memory device 301 along with the analog data signals for use in programming the individual memory cells. Programming can occur on a cell-by-cell basis, but is generally performed for a page of data per operation. For a typical memory array architecture, a page of data includes every other memory cell coupled to a word line.

For read requests, the controller would pass command and address signals to the read/write channel 305. The read/write channel 305 would pass the read command and address signals to the memory device 301. In response, after performing the read operation, the memory device 301 would return the analog data signals indicative of the threshold voltages of the memory cells defined by the address signals and the read command. The memory device 301 may transfer its analog data signals in parallel or serial fashion.

The analog data signals may also be transferred not as discrete voltage pulses, but as a substantially continuous stream of analog signals. In this situation, the read/write channel 305 may employ signal processing similar to that used in HDD accessing called PRML or partial response, maximum likelihood. In PRML processing of a traditional HDD, the read head of the HDD outputs a stream of analog signals representative of flux reversals encountered during a read operation of the HDD platter. Rather than attempting to capture the true peaks and valleys of this analog signal generated in response to flux reversals encountered by the read head, the signal is periodically sampled to create a digital representation of the signal pattern. This digital representation can then be analyzed to determine the likely pattern of flux reversals responsible for generation of the analog signal pattern. This same type of processing can be utilized with embodiments of the present disclosure. By sampling the analog signal from the memory device 301, PRML processing can be employed to determine the likely pattern of threshold voltages responsible for generation of the analog signal.

Figure 4:
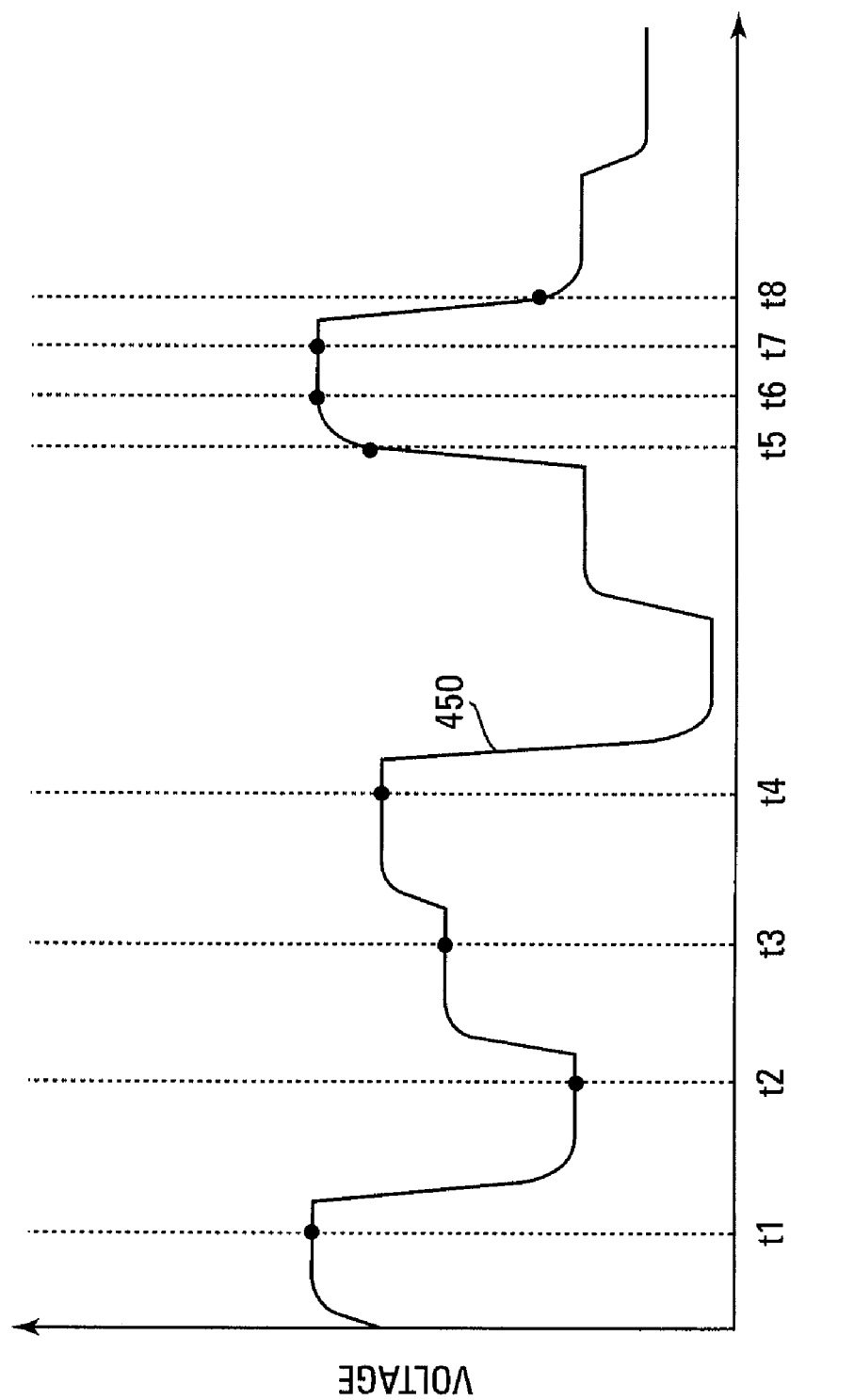
FIG. 4 is a depiction of a wave form showing conceptually a data signal as might be received from the memory device by a read/write channel in accordance with an embodiment of the disclosure.

FIG. 4 is a depiction of a wave form showing conceptually a data signal 450 as might be received from the memory device 301 by the read/write channel 305 in accordance with an embodiment of the disclosure. The data signal 450 could be periodically sampled and a digital representation of the data signal 450 can be created from the amplitudes of the sampled voltage levels. For one embodiment, the sampling could be synchronized to the data output such that sampling occurs during the steady-state portions of the data signal 450. Such an embodiment is depicted by the sampling as indicated by the dashed lines at times t1, t2, t3 and t4. However, if synchronized sampling becomes misaligned, values of the data samples may be significantly different than the steady-state values. In an alternate embodiment, sampling rates could be increased to allow determination of where steady-state values likely occurred, such as by observing slope changes indicated by the data samples. Such an embodiment is depicted by the sampling as indicated by the dashed lines at times t5, t6, t7 and t8, where a slope between data samples at times t6 and t7 may indicate a steady-state condition. In such an embodiment, a trade-off is made between sampling rate and accuracy of the representation. Higher sampling rates lead to more accurate representations, but also increase processing time. Regardless of whether sampling is synchronized to the data output or more frequent sampling is used, the digital representation can then be used to predict what incoming voltage levels were likely responsible for generating the analog signal pattern. In turn, the likely data values of the individual memory cells being read can be predicted from this expected pattern of incoming voltage levels.

Recognizing that errors will occur in the reading of data values from the memory device 301, the read/write channel 305 may include error correction. Error correction is commonly used in memory devices, as well as HDDs, to recover from expected errors. Typically, a memory device will store user data in a first set of locations and error correction code (ECC) in a second set of locations. During a read operation, both the user data and the ECC are read in response to a read request of the user data. Using known algorithms, the user data returned from the read operation is compared to the ECC. If the errors are within the limits of the ECC, the errors will be corrected.

Figure 5:
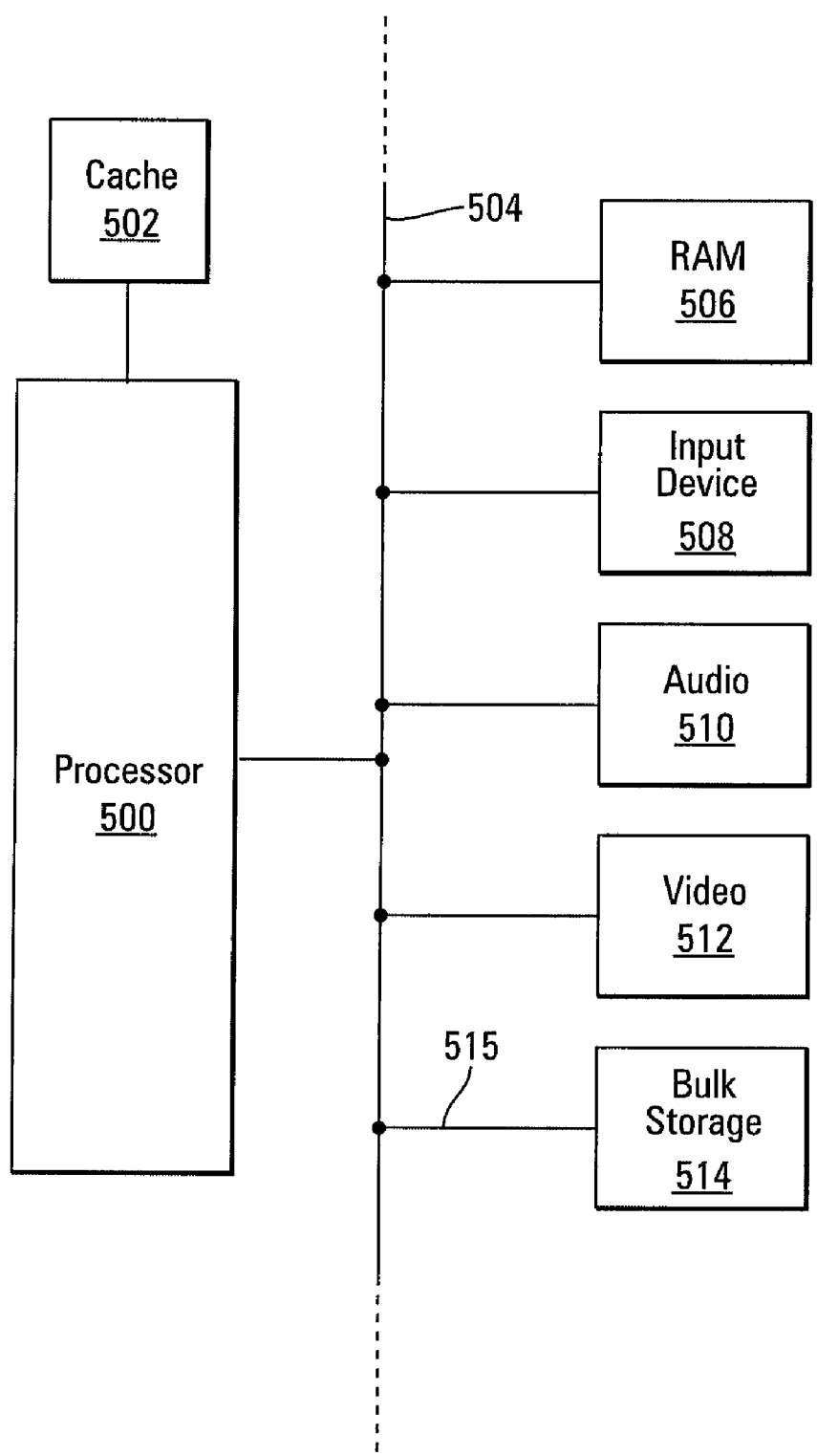
FIG. 5 is a block schematic of an electronic system in accordance with an embodiment of the disclosure.

FIG. 5 is a block schematic of an electronic system in accordance with an embodiment of the disclosure. Example electronic systems may include personal computers, PDAs, digital cameras, digital media players, digital recorders, electronic games, appliances, vehicles, wireless devices, mobile telephones and the like.

The electronic system includes a host processor 500 that may include cache memory 502 to increase the efficiency of the processor 500. The processor 500 is coupled to a communication bus 504. A variety of other devices may be coupled to the communication bus 504 under control of the processor 500. For example, the electronic system may include random access memory (RAM) 506; one or more input devices 508 such as keyboards, touch pads, pointing devices, etc.; an audio controller 510; a video controller 512; and one or more bulk storage devices 514. At least one bulk storage device 514 includes a digital bus interface 515 for communication with the bus 504, one or more memory devices in accordance with an embodiment of the disclosure having an analog interface for transfer of data signals representative of data patterns of two or more bits of data, and a signal processor adapted to perform digital-to-analog conversion of digital data signals received from the bus interface 515 and analog-to-digital conversion of analog data signals received from its memory device(s).

Leakage Compensation During Program and Read Operations

As stated above, when data is transferred to memory device embodiment or read from the internal array the data is often temporarily held in a data cache, such as a sample and hold circuit. This data transfer can be either to or from an external device and the data cache in the memory or to or from the internal array and can occur during various memory operations including, but not limited to, programming data into the non-volatile memory array, verifying programmed data, internal data move and/or masking operations, and data comparison operations. It is noted that memory operations can be initiated in a memory device in response to either an externally received command or by local (e.g., internal to the memory device or memory system) control, such as automatic housekeeping tasks under the initiative of the control logic or memory controller.

In one or more memory embodiments of the present invention the sample and hold circuitry can temporarily latch this data in the form of voltage levels while internal memory operations or external data transfer take place. For example, the sample and hold circuitry could contain capacitors or other analog storage devices for sampling either an incoming voltage signal representing data to be written to a memory cell or an outgoing voltage signal indicative of the threshold voltage sensed from a memory cell of the array. The sample and hold circuitry may also provide for amplification and/or buffering of the sampled voltage to provide a stronger data signal for further data operations, such as data transfer to an external device, data comparison, or array programming.

Unfortunately, while the data is being held in the data cache the voltage levels can deteriorate, even in the short time it will be held in the data cache. This is particularly the case with data cache circuits utilizing capacitor-based sample and hold circuits, primarily due to charge leakage from the sample and hold capacitors of the data cache. Charge leakage in the holding capacitors can be due to a variety of factors and can be related to feature sizes, materials and environmental factors. These factors can include, but are not limited to, insulator materials, insulator thinness in and around the capacitors, reduced feature sizes in modern integrated circuit processes, operating temperature and voltage, thermal emission, and leakage to the substrate.

The data cache leakage effects (also known as leakage errors) are generally of two differing forms; leakage effects that are uniform across the holding capacitors of the data cache holding circuits, and leakage effects that are non-uniform across the data cache. Uniform charge leakage typically occurs as charge leaks in a uniform manner from each holding capacitor in the data cache as the data is held during an extended time period. This typically can occur during a memory operation, such as a programming operation, read operation or verify/comparison operation and can affect results or, e.g., induce errors. Non-uniform charge leakage typically occurs while data is being transferred sequentially to the data cache or sections of the data in the data cache are masked or replaced in-situ during a data move operation and, as such, the leakage induced error effects are unevenly spread across the holding capacitors of the data cache. Because of the increasingly large data sizes of modern non-volatile memory data caches as the data is sequentially transferred to the memory the data cache will have leaked stored charge and have altered the initially held data before the data is fully transferred into the data cache. Conversely, as the data is sequentially transferred from the data cache and memory the final voltage data read from the data cache will have been altered relative to the first transferred voltage data before they are transferred from the data cache because of leaked charge. It is noted that the voltages of the data pattern can also affect the rate of charge leakage, with higher voltages decaying at increased rates as compared to lower voltage levels.

It is noted that although the various embodiments will be described primarily with reference to NAND memory arrays, the various embodiments are not limited to a specific architecture of the memory array. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

It is also noted, as detailed above, that various embodiments of the present invention include memory devices adapted to process and generate analog data signals representative of the stored bits of data in each cell. This is facilitated by storing data values as threshold voltages on a non-volatile memory cell. Unlike the bit-by-bit programming operations of traditional multi-level cell technology, the various embodiments may program directly to a target threshold voltage for the desired data. Similarly, instead of reading individual bits, the various embodiments generate a data signal indicative of the threshold voltage of the target memory cell, and thus indicative of the bits of data read from each cell. However, it is further noted that, while various embodiments may receive and transmit the data signals as one or more analog signals (i.e., serial or parallel bus transmissions) representative of bit patterns of two or more bits, digital embodiments are also possible that provide conversion internal to the memory device to an analog signal or selected threshold voltage range/state to permit receiving and transmitting digital signals representative of individual bits. It is also noted that in utilizing analog data signals, because a single analog data signal could represent two, four or more bits of information, data transfer rates may be increased along with memory density as each program or read operation is concurrently processing multiple bits per memory cell.

As stated above, data cache leakage effects are generally of two differing forms resulting from two differing types of time delay and data operation on the memory's data cache. In the first, the voltage data (e.g., charge) held in the data cache is held statically as a reference, is stored to or from in the array, or utilized in internal memory operations. As such, charge leakage uniformly affects the voltage data held in the data cache. This typically occurs as data is being held during ongoing internal execution of operations in the memory. Such memory operations include, but are not limited to, program cycles, verify operations, data moves operations, read operations, and data comparisons)

In the second, data is typically being transferred into the data cache from an external device and the charge leakage non-uniformly affects the voltage data held in the data cache as voltage data is written to the data cache. These sequential data transfer operations typically occur during the initial portion of programming operations, data comparison operations, or operations requiring data masking (such as data moves) as data is transferred to the data cache in advance of internal execution of the operation. As the capacitors in the data cache are sequentially charged in accordance with voltage data, prior charged capacitors will exhibit higher levels of leakage than subsequently-charged capacitors.

In uniform effect charge leakage situations, a reference capacitor can be charged using a known voltage level for use as a charge leakage estimation model as soon as data has been completely loaded into the data cache, such as in a parallel transfer or at the start of internal operations on data held in the data cache. It is noted that other charge leakage estimation models are possible, including, but not limited to initiating a timer and utilizing a look-up table or leakage estimation calculation circuit with the current timer value. The held data value charges are then compensated for the uniform charge leakage, such as by adjusting a common reference (e.g., a ground) node coupled to the data capacitors by an error effect amount to compensate for the charge leakage. Alternatively, an offset of buffering differential amplifiers (or a gain of the amplifiers) associated with each individual data capacitor in the data cache can be adjusted over time at least partially based on the leakage model (e.g., on the reference capacitor).

Non-uniform effect charge leakage in the data cache can be compensated for by initiating the charge leakage model (e.g., charging the reference capacitor) upon initiating sequential data transfer to the data cache. A ground node associated with each separate data holding capacitor can then be adjusted by a selected (e.g., scaled) effect amount in relation to the leakage model in the sequential order in which the data was transferred into the data cache. As prior charged capacitors will exhibit higher levels of leakage than subsequently-charged capacitors due to the sequential charging, by applying reducing voltages to ground nodes of the subsequently-charged capacitors, observed voltage differences between capacitors thus more accurately represent the intended differences. In one embodiment, this is accomplished by applying a positive potential to the ground nodes through a graduated resistance path or other voltage divider, such that subsequently charged capacitors receive ever higher resistance levels from the positive potential and thus see a ground potential closer to that of the nominal ground potential. Alternatively, an offset or gain of buffering differential amplifiers associated with each individual data capacitor in the data cache can be adjusted at least partially based on the leakage model and the sequential data transfer pattern. It is noted that it is not necessary for the data transfer be sequential, only that a predictable data transfer pattern exist and that leakage compensation be selected according to that data transfer pattern.

It is also noted that external data transfers that occur out of the data cache are also typically sequentially transferred. However, the leakage effects on the data charge held in the capacitors of the data cache in this operation are actually uniform across the data cache. The leakage effect is only perceived externally as being non-uniform in nature due to data being sequentially read from the data cache while the uniform leakage occurs. Thus sequential data transfers out of the data cache and memory can be compensated for by utilizing a uniform effect data cache charge leakage compensation as disclosed above.

As also stated above, during a write operation, target memory cells of the memory array are programmed until voltages indicative of their Vt levels match the data levels held in the data cache. This can be accomplished, as one example, using differential sensing devices to compare the voltage level held by the data cache to a threshold voltage of the target memory cell. Much like traditional memory programming, programming pulses could be applied to a target memory cell to increase its threshold voltage until reaching or exceeding the desired value.

In a read operation, the Vt levels of the target memory cells are passed to the data cache for transfer to an external device, such as a processor or memory controller, either directly as analog signals or as digitized representations of the analog signals depending upon whether ADC/DAC functionality is provided external to, or within, the memory device. As also stated above, during a read operation in memory device embodiments the threshold voltages of cells may be determined in a variety of manners. For example, a word line voltage could be sampled by the data cache at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to the data cache, charge would be shared with the capacitor to "store" the sampled voltage in the data cache. Note that, as stated above, the sampled voltage need not be equal to the threshold voltage, but only representative of that voltage.

Figure 6:
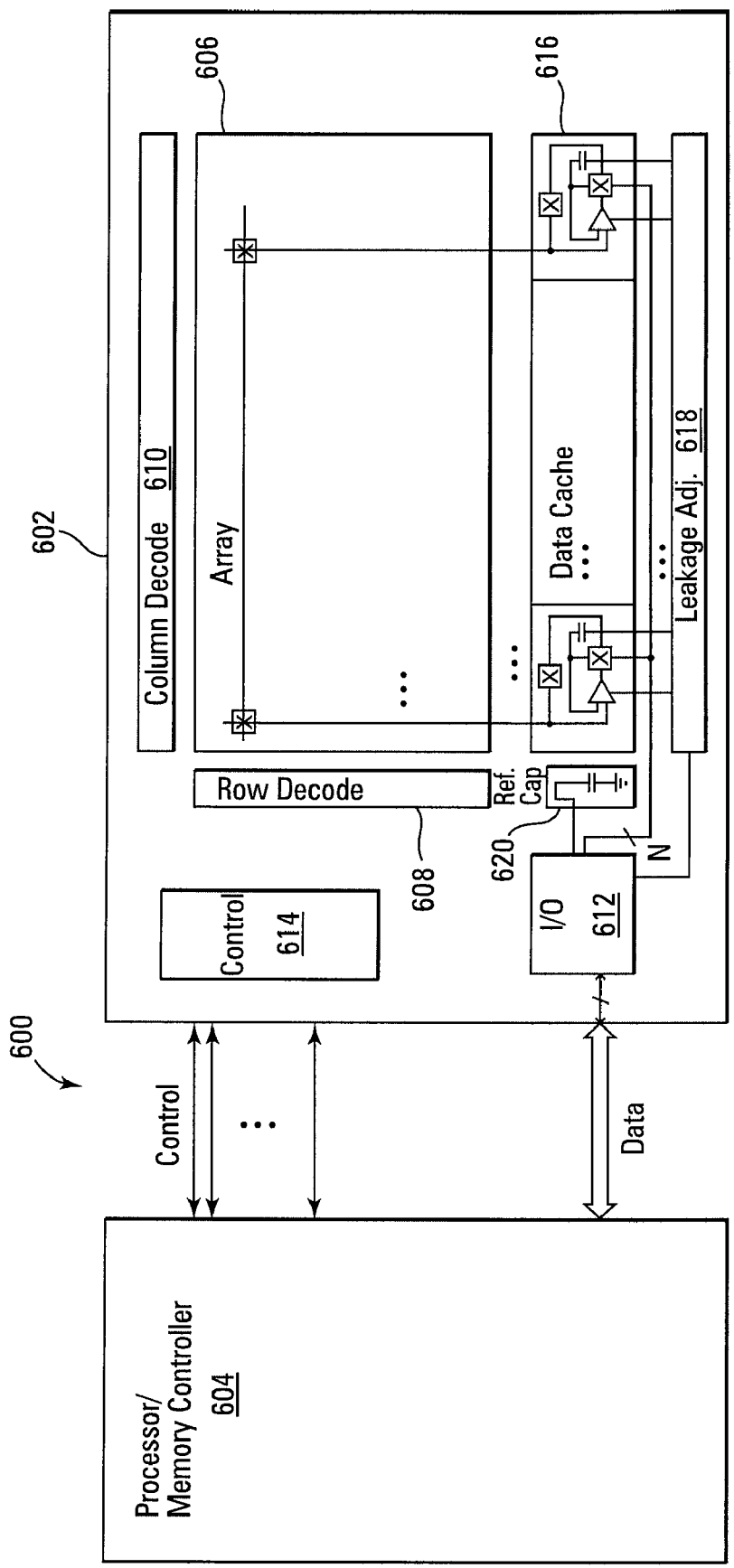
FIG. 6 show a simplified diagram detailing an electronic system having a memory device with a data cache in accordance with an embodiment of the present invention.

In FIG. 6, a simplified diagram of a system 600 is illustrated having a non-volatile memory device 602 coupled to a host 604, such as a processor or memory controller. It is noted that the host can be external to the memory device as an external device or the memory device can be an internal component of a larger device that also incorporates the host. The non-volatile memory device 602 includes an array of memory cells 606 arranged in rows and columns. A row decode circuit 608 and a column decode circuit 610 are provided to decode address signals provided to the memory device 602 by the host 604. Address signals are received and decoded to access memory array 606. Memory device 602 also includes input/output (I/O) control circuitry 612 to manage input of commands, addresses and data to the memory device 602 as well as output of data and status information from the memory device 602. Control logic 614 controls access to the memory array 606 in response to commands and generates status information for the external host 604. The control logic 614 is coupled to row decode circuit 608 and column decode circuit 610 to control the row decode circuit 608 and column decode circuit 610 in response to the addresses. The control logic 614 is also coupled to a data cache 616, which latches data, either incoming or outgoing, in the form of voltage levels and is coupled to the memory array 606 and the I/O control circuit 612. The data cache can contain capacitors for sampling either an incoming voltage signal representing data to be written to a memory cell or an outgoing voltage signal indicative of the threshold voltage sensed from a memory cell. Additionally, the data cache holding capacitors (or other alternative storage devices) are subject to charge leakage that introduces errors in the sampled and stored data. The data cache 616 can further provide for amplification and/or buffering of the sampled voltage to provide a stronger data signal. Additionally, a charge leakage model, such as a reference capacitor, 620 and a leakage adjustment circuit 618 are coupled to the I/O circuit 612. The leakage adjustment circuit 618 is also coupled to the individual holding capacitors and/or amplifiers of the data cache 616 and allows for adjustment of the voltage level charges stored in the data holding capacitors of the data cache 616 to compensate for charge leakage.

As noted above, the charge leakage model 620 is typically initiated (e.g., charged) at the start of a sequential data transfer to the data cache 616 (such as data transferred from the host 602 in a program or mask operation) to estimate the non-uniform charge loss of data transferred to the memory 602. Alternatively, the charge leakage model 620 is initiated as soon as data is fully stored in the data cache 616 to estimate uniform charge loss, such as occurs during internal memory operations or after data is read from the array 606 in parallel and stored in the data cache 616 for transfer from the memory device 602. It is noted that in various embodiments an adjustment signal can be generated off the charge leakage model 620 using a differential amplifier with a voltage output of the charge leakage model 620 and a stable voltage reference as a second input to the differential amplifier for use by the I/O circuit 612 and leakage adjustment circuit 618 in compensating for lost charge.

Once the charge leakage effect is estimated by action of the charge leakage model 620, the individual data cache data voltages are adjusted utilizing the leakage adjustment circuit 618. Held data values can then be compensated for in uniform charge leakage by adjusting a common ground node coupled to the data capacitors by the effect amount to compensate for the charge leakage. Alternatively, an offset or gain of the differential amplifiers associated with each individual data capacitor in the data cache can be adjusted over time at least partially in relation to the leakage model.

In non-uniform, a ground node associated with each data holding capacitors can be adjusted by a scaled amount at least partially in relation to the leakage model by the sequential order in which the data was transferred into the data cache. Alternatively, an offset or gain of the buffering differential amplifiers associated with each individual data capacitor in the data cache can be adjusted at least partially based on the leakage model and the sequential data transfer pattern.

Figure 7A:
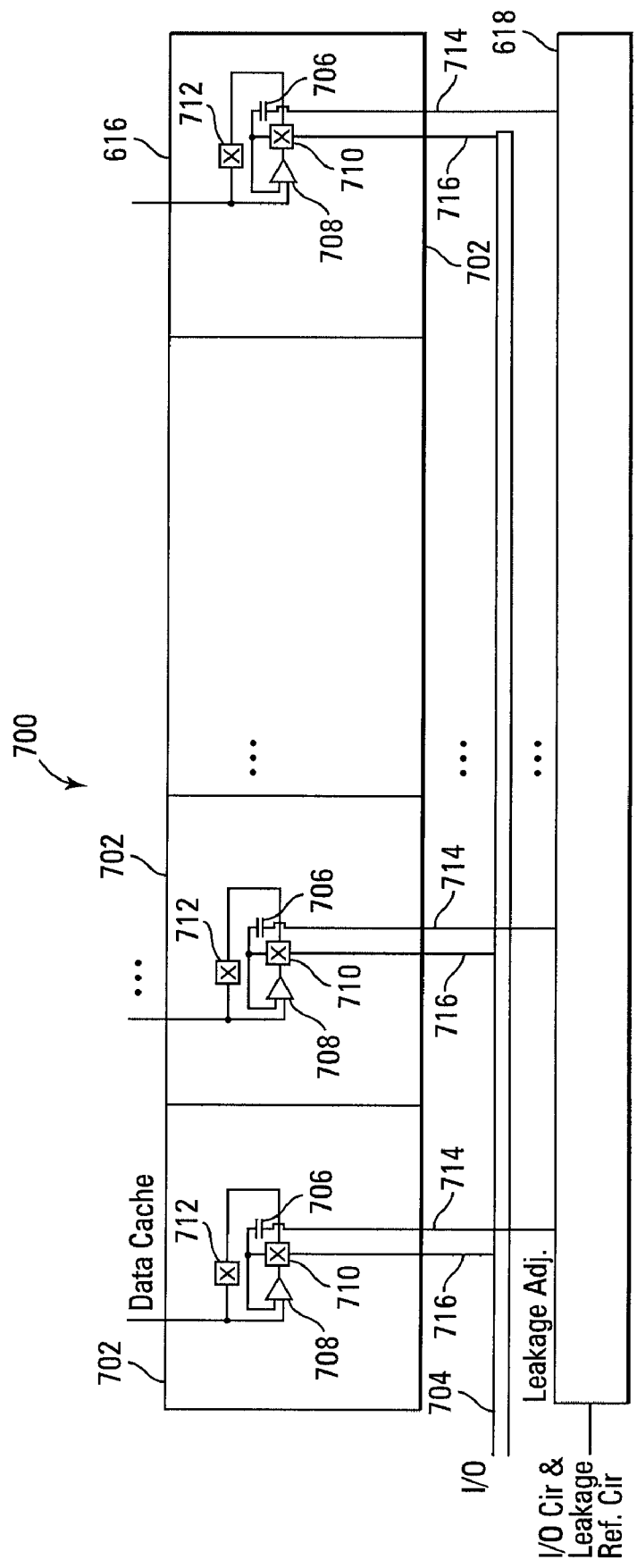
FIGS. 7A-7C show diagrams detailing data caches and leakage adjustment in accordance with embodiments of the present invention.
Figure 7B:
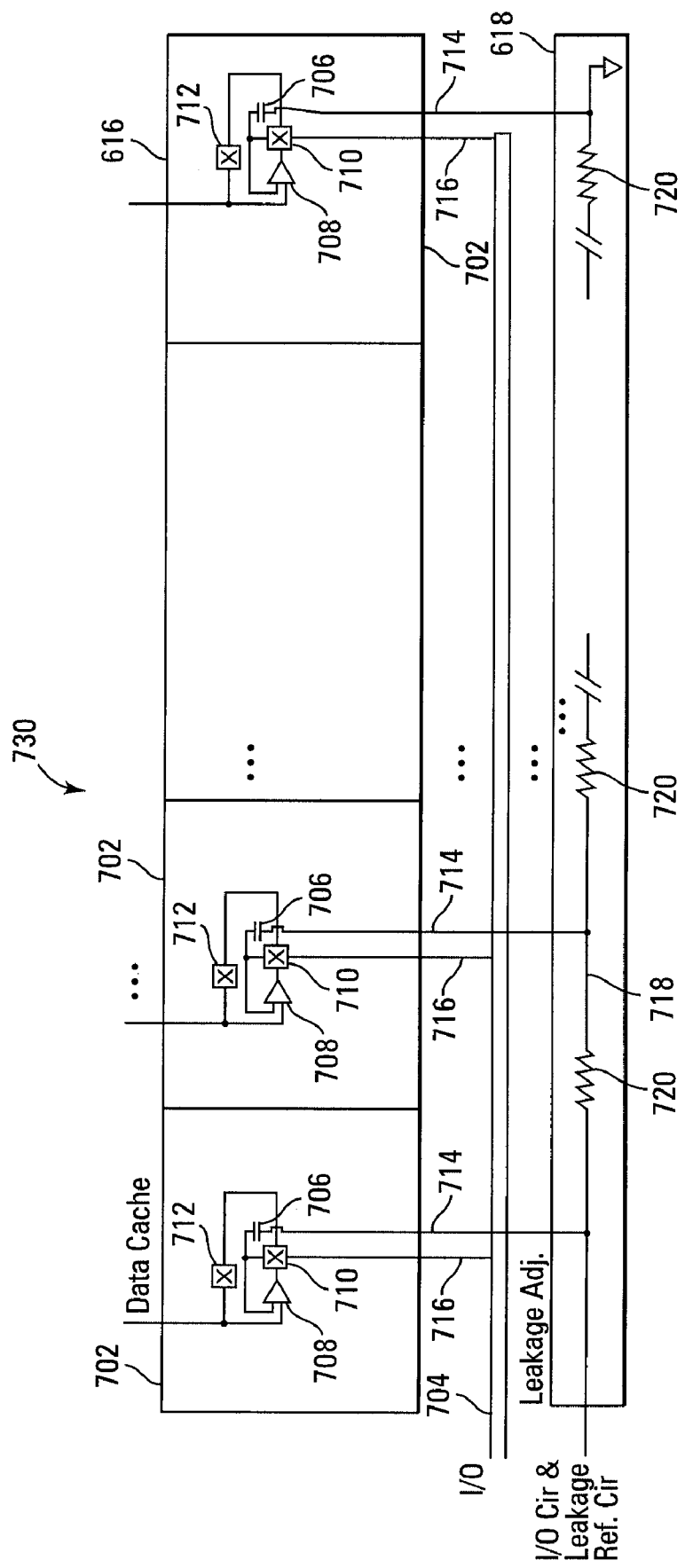
Figure 7C:
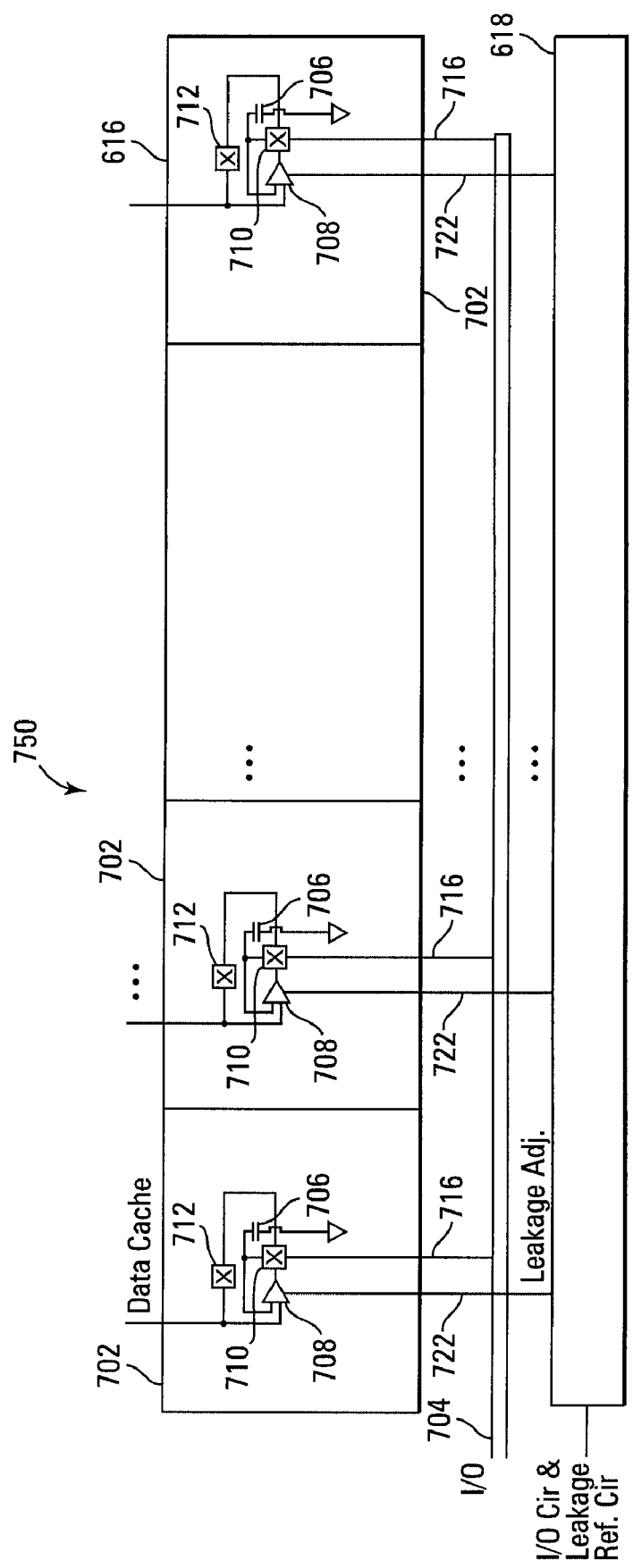

FIGS. 7A, 7B, and 7C detail various data caches and associated leakage adjustment circuits 700, 730, 750 of embodiments of the present invention. In FIGS. 7A, 7B, and 7C, as noted above, the data cache 616 latches voltage levels and is coupled to data lines (e.g., bit lines) of the memory array 606 via the column decoder 610. Data is externally coupled to and from the data cache 616 of the memory 602 utilizing an I/O bus 704 from the I/O control circuit 612. Each data cell 702 of the data cache 616 is coupled to the I/O bus 704 to transmit or receive a single voltage value 716. Internal to each data cell 702 a differential buffer amplifier 708 is coupled under control of switches 710 and 712 to buffer the sampled voltage level of a coupled bit line and/or the voltage level corresponding to the charge stored in the sample and hold capacitor 706, or to couple the input data value on the I/O bus 704 to charge the sample and hold capacitor 706, or to output the sampled data value during a programming operation.

In FIG. 7A, the sample and hold capacitor 706 of each data cell 702 of the data cache 616, 700 had its second terminal (its "ground node") coupled to the leakage adjustment circuit 618 allowing for the perceived stored voltage to be adjusted to compensate for uniform or non-uniform charge leakage in the data cache 616. One embodiment of a leakage adjustment circuit 618 is shown in FIG. 7B. In FIG. 7B, the leakage adjustment circuit utilizes a resistive ladder 720 as a voltage divider to set the charge leakage compensation on the ground node 714 of the cells 702 of the data cache to compensate for non-uniform data input leakage effect. An adjustment signal generated from the leakage model applies a positive potential to the ground reference nodes through a graduated resistance path 718, with each subsequently charged capacitor seeing a higher resistance level and thus a ground reference potential closer to the nominal ground potential.

In FIG. 7C, a data cache 616, 750 is illustrated in which each data cell 702 is adjusted for charge leakage via an input offset or gain adjustment 722 from the leakage adjustment circuit 618 that is coupled to the differential amplifier 708 associated with each individual data capacitor 706 in the data cache 616, 750, allowing the output of the amplifier in relation to the data held by the capacitor 706 to be adjusted in relation to the leakage model by adjusting the amplified version of the voltage stored in the data cell 702 by the amplifier 708.

Figure 8:
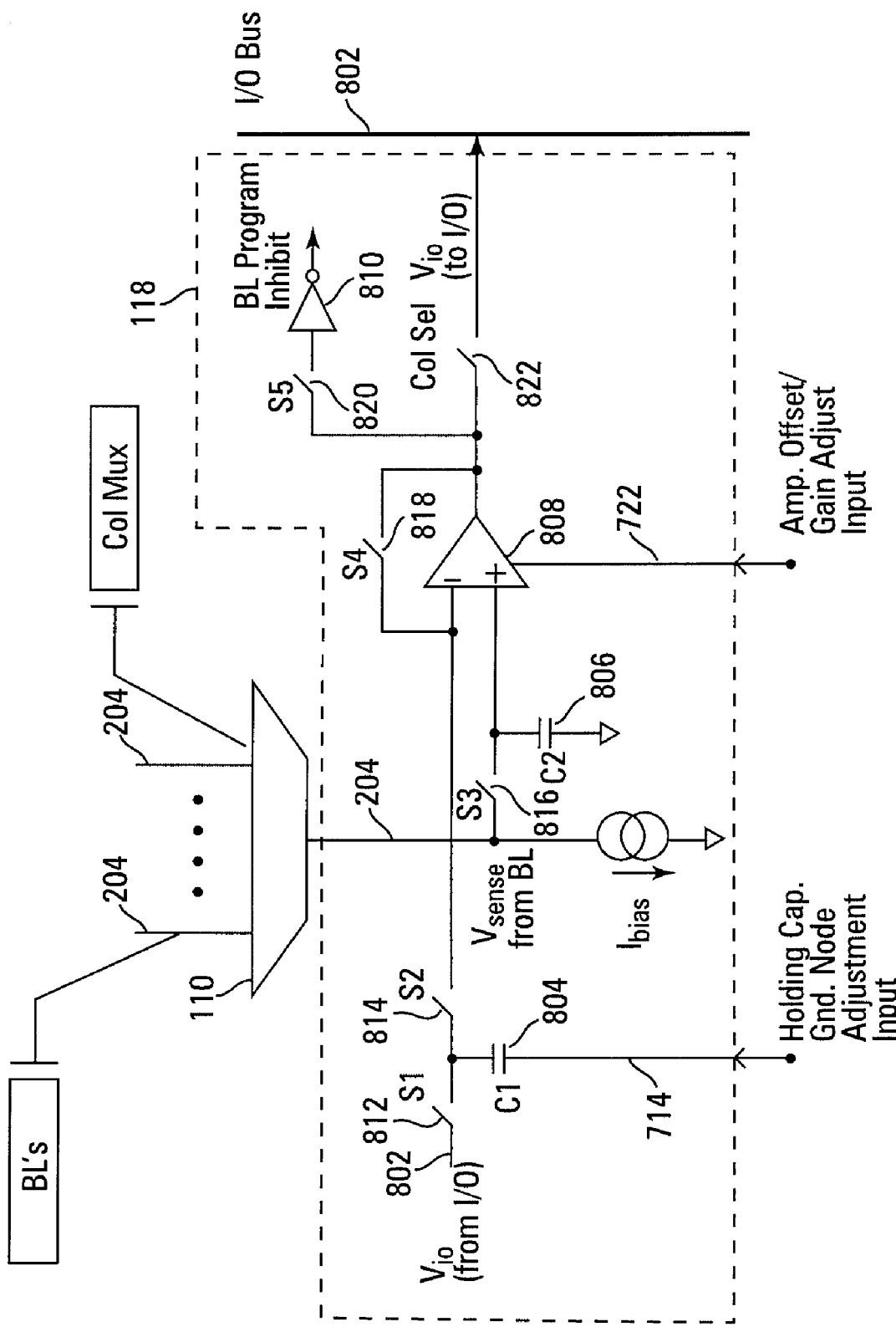
FIG. 8 show a diagram detailing another data cache with leakage adjustment in accordance with an embodiment of the present invention.

FIG. 8 details a cell of another data cache 118 of a NAND architecture memory embodiment of the present invention. In FIG. 8, the data cache circuit 118 is coupled to a bit line 204 through the column multiplexer (also known as a column mux) of the column decode circuit 110. The data cache 118 is also connected to I/O Bus 802. Internal to the data cache 118, a bit line sample capacitor C2 806 is coupled to the bit line 204 selected by the column multiplexer 110 by switch S3 816 (typically a FET transistor that is operated as a pass gate or switch). In addition, the data cache 118 also contains an incoming data sample capacitor C1 804, that can be coupled to the I/O Bus 802 through switch S1 812 to sample incoming data, typically input as an analog signal having a voltage level. The incoming data sample capacitor C1 804 is adjustable by a leakage adjustment circuit 618 by changing the voltage on the ground reference node 714. An amplifier (such as an operational amplifier 808) can also be incorporated in the data cache 118 and has an input offset or gain adjustment 722 allowing adjustment by a leakage adjustment circuit 618. The operational amplifier 808, depending on the mode of operation of the memory, can be configured and operated as either a comparator to compare the voltages of capacitors C1 804 and C2 806, or as a unity amplifier/output buffer to output the sampled bit line voltage from capacitor C2 806 on to the I/O bus 802. To operate as a comparator, capacitor C1 804 is coupled to an input of the operational amplifier 808 through switch S2 814, while switch S4 818 is opened to disable the feedback path of the amplifier 808. The voltage of capacitor C1 804 is then compared against the voltage of capacitor C2 806 (which is coupled to the other input of the operational amplifier 808) by an internal differential amplifier and the high open circuit gain of the operational amplifier 808 with the results expressed on the output. To operate as an output buffer, the switch S2 814 is opened to disconnect capacitor C1 804 and switch S4 818 is closed to enable the feedback path and allow the operation amplifier 808 to act as a unity gain amplifier, buffering the voltage on capacitor C2 806 and expressing it on the amplifier's 808 output.

In a sense operation in the memory of FIG. 8, bias conditions are applied to the NAND string by applying an elevated read pass voltage (Vpass) to the word lines of the unselected memory cells ($208_{31}$-$208_{N+1}$, $208_{N-1}$-$208_0$), allowing them to pass current in a manner that is unrestricted by their stored data values. An elevated voltage, Vsource (such as Vcc or higher), is applied to the source line 216, while select gate voltages ($V_{SGD}$ and $V_{SGS}$) are also applied to the gates of the select gate FETs, coupling the NAND string to the source line 216 and bit line 204, respectively. A read gate voltage (Vgate) is applied to the word line $202_N$ connected to the selected memory cell $208_N$ to operate it in an active mode. Current (B/L current) then flows through the NAND string from the source line 216 to the bit line 204 through the selected memory cell $208_N$, raising the voltage of the column bit line 204 to that of the applied read voltage minus the programmed threshold voltage (Vgate-Vt) of the selected cell $208_N$. The bit line 204 is selected by the column multiplexer of the column address decoder circuit 110 and coupled to the sample and hold circuit 118. In preparation for sensing, the sample and hold circuit 118 turns off switches S1 802 and S2 814 to isolate capacitor C1 804, capacitor C2 806 is also isolated from the bit line 204 by turning off switch S3 816. In addition, switch S5 820 is also turned off to isolate the bit line inhibit circuit 810, while switch S4 818 is turned on to couple the operational amplifier 808 as an output buffer/unity gain amplifier. Once the voltage (Vsense or Vout) on the selected bit line 204 has stabilized, it is sampled by the sample and hold circuit 118 by turning on switch S3 816 and coupling capacitor C2 806 to the bit line 204. The voltage of the bit line 204, as sampled by the capacitor C2 806, is buffered by the operational amplifier 808 and can then be coupled to the I/O Bus 802 for output by closing switch Col_Sel 822. It is noted that once the bit line voltage (Vsense) has been sampled by capacitor C2 806, switch S3 816 can be turned off to isolate the capacitor from the bit line 204, allowing the array to begin the next sensing cycle while the sampled voltage is read out of the memory. It is also noted that the selected memory cell threshold voltage can be determined from the sampled bit line voltage (Vsense) by subtracting the gate voltage (Vgate) from the sampled bit line voltage (Vsense). E.g., Cell Vt=Vgate−Vsense.

In a program and verify operation in the data cache of FIG. 8, an incoming data voltage is first sampled and held in capacitor C1 804 as a target or desired threshold voltage by turning on switch S1 812 to couple capacitor C1 804 to the I/O Bus 802. Switch S2 814 is typically turned off during this process. After the capacitor C1 804 has charged the voltage expressed on the I/O Bus 802, switch S1 812 is then turned off to capture the desired incoming data voltage. A memory cell $208_N$ is then selected and programmed by applying a programming voltage pulse to its control gate $202_N$ and applying a ground or low voltage to the channel to place charge onto its floating gate and alter the threshold voltage. The threshold voltage of the selected memory cell $208_N$ is then verified by re-selecting and sensing the selected memory cell $208_N$ and comparing the sensed threshold voltage against the target voltage stored in capacitor C1 804 in a verify operation.

To accomplish the verify operation, switch S4 818 is turned off to configure the operational amplifier 808 as a comparator and coupling the output of the operational amplifier 808 to the bit line inhibit circuit 810 by turning on switch S5 820 and confirming that the "Col_Sel" switch 822 is off (to disconnect the output of the operational amplifier 808 from the I/O Bus 802). In addition, switch S1 812 is left in an off state, while switch S2 814 is turned on to couple target voltage stored on the capacitor C1 804 to an input of the operational amplifier 808. Sensing bias conditions are applied to the NAND string by applying an elevated read pass voltage (Vpass) to the word lines of the unselected memory cells ($208_{31}$-$208_{N+1}$, $208_{N-1}$-$208_0$), while select gate voltages ($V_{SGD}$ and $V_{SGS}$) are also applied to the gates of the select gate FETs to couple the NAND string to the source line 216 and bit line 204, respectively. An elevated voltage, Vsource, is applied to the source line 216 and a read gate voltage (Vgate) is applied to the word line $202_N$ connected to the selected memory cell $208_N$ to operate it in an active mode. Current (B/L current) flowing through the NAND string from the source line 216 to the bit line 204, raises the voltage of the column bit line 204 to that of the applied read voltage minus the programmed threshold voltage (Vgate-Vt) of the selected cell $208_N$. The bit line 204 is selected by the column multiplexer of the column address decoder circuit 110 and coupled to the sample and hold circuit 118. Once the voltage (Vsense or Vout) on the selected bit line 204 has stabilized, it is sampled by the sample and hold circuit 118 by turning on switch S3 816 and coupling capacitor C2 806 to the bit line 204. The voltage of the bit line 204, as sampled by the capacitor C2 806. The operational amplifier, configured as a comparator, then compares the target voltage and the sensed bit line voltages coupled to its inputs from capacitors C1 804 and C2 806, respectively. If the sensed voltage of the selected memory cell $208_N$ (as sampled and held on capacitor C2 806) is lower than that of the target voltage (as sampled and held in capacitor C1 804), the operational amplifier 808 output is high and the output of the inverter of the coupled bit line program inhibit circuit 810 is thus low, indicating further programming pulses are required. If the sensed voltage of the selected memory cell $208_N$, sampled and held on capacitor C2 806, is higher than that of the target voltage held in capacitor C1 804, the operational amplifier 808 output is low and the output of the inverter of the coupled bit line program inhibit circuit 810 is high, indicating that no further programming pulses are required. In one embodiment, this output from the bit line program inhibit circuit 810 is utilized to set the voltage coupled to the channel of the selected memory cell, setting it at a low or ground potential voltage (program) or high voltage (program-inhibit, such as Vcc), depending on if the output of the bit line program inhibit circuit 810 is low or high, respectively. This program and verify cycle can be repeated until the target voltages are successfully programmed or repeated until a selected number of iterations have passed without all the target voltages being successfully verified and the programming operation is deemed to have failed. It is also noted that in one embodiment, the target voltage is represented as the desired Vsense to be sensed and not the direct memory cell threshold voltage (e.g., Cell Vt=Vgate-Vsense, thus Vtarget=Vsense=Vgate-Cell Vt). It is also noted that in another embodiment Vsense, sampled and stored in capacitor C2 806, can be first converted to the sensed threshold voltage of the selected memory cell $208_N$ by subtracting Vgate from it before comparison with the target threshold voltage stored in capacitor C1 804.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

CONCLUSION

A non-volatile memory device and process has been described that should reduce the effects of charge leakage from data cache sample and hold circuit capacitors, maintaining stored voltage levels as data is utilized in memory operations or transferred into or out of the memory. In particular, in one embodiment of the present invention, the held data values are compensated for charge leakage effects that are uniform across the data holding capacitors of the data cache by writing a reference capacitor or initiating some other leakage model and either uniformly adjusting a ground node of the data capacitors by the effect amount or by adjusting an amplifier offset or gain of an amplifier associated with each individual data capacitor in the data cache in relation to the leakage model at a given time. In another embodiment of the present invention, the held data values are compensated for charge leakage effects that are non-uniform due to the data values being sequentially transferred to the holding capacitors of the data cache by initiating a leakage model at the start of data transfer and then scaling the adjustment of each ground node of the data capacitors by an effect amount or by adjusting an amplifier offset or gain of an amplifier associated with each individual data capacitor in the data cache in relation to the leakage model and the sequential order in which the data was transferred into the data cache.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of operating a memory, comprising:
   estimating a charge loss using a charge leakage model;
   storing a plurality of voltages in a plurality of storage devices in a data cache of a memory; and
   compensating the plurality of storage devices for charge loss at least partially based on the estimated charge loss.

2. The method of claim 1, wherein the storage devices are capacitances.

3. The method of claim 2, wherein the capacitances comprise capacitors.

4. The method of claim 1, wherein the charge leakage model is one of a reference capacitor and a timer.

5. The method of claim 1, wherein compensating the plurality of storage devices further comprises adjusting a ground reference node coupled to the storage devices of the data cache.

6. The method of claim 1, wherein compensating the plurality of storage devices further comprises adjusting one of an offset and a gain of amplifiers coupled to each storage device of the plurality of storage devices of the data cache.

7. The method of claim 1, wherein compensating the plurality of storage devices further comprises adjusting at least partially based on the data pattern.

8. The method of claim 1, compensating the plurality of storage devices further comprises amplifying and/or buffering.

9. A non-volatile memory, comprising:
a non-volatile memory array having a plurality of non-volatile memory cells;
a data cache having a plurality of storage devices; and
a charge leakage model;
wherein the non-volatile memory is adapted to compensate the plurality of storage devices for uniform charge loss at least partially based on an output of the charge leakage model by,
estimating a charge loss using the charge leakage model,
storing a plurality voltages in the plurality of storage devices of the data cache, and
compensating the plurality of analog storage devices for charge loss at least partially based on the charge leakage model.

10. The non-volatile memory of claim 9, wherein the data cache further comprises sample and hold circuitry.

11. The non-volatile memory of claim 9, wherein the charge leakage model is one of a reference capacitor and a timer.

12. The non-volatile memory of claim 9, wherein the memory is adapted to compensate the plurality of storage devices at least partially based on the charge leakage model by one of uniformly adjusting a ground node coupled to the storage devices of the data cache to compensate for charge loss, and non-uniformly adjusting a ground node coupled to each separate storage device of the plurality of storage devices of the data cache to compensate for charge loss.

13. The non-volatile memory of claim 9, wherein the memory is adapted to compensate the plurality of storage devices at least partially based on the charge leakage model by one of uniformly adjusting an amplifier offset or an amplifier gain of an amplifier coupled to each analog storage device of the plurality of storage devices of the data cache, and non-uniformly adjusting an amplifier offset or an amplifier gain of an amplifier coupled to each analog storage device of the plurality of storage devices of the data cache to compensate for charge loss.

14. A method of operating a memory, comprising:
initiating a charge leakage model;
transferring a plurality of voltages to a memory and storing them in a plurality of storage devices of a data cache of the memory; and
compensating the plurality of storage devices for non-uniform charge loss at least partially based on an output of the charge leakage model.

15. The method of claim 14, wherein the data cache further comprises capacitive sample and hold circuitry.

16. The method of claim 14, wherein compensating the plurality of storage devices for non-uniform charge loss at least partially based on an output of the charge leakage model further comprises compensating the plurality of storage devices for non-uniform charge loss adjusting by a scaled amount at least partially based on an output of the charge leakage model in an order in which the voltages are transferred.

17. The method of claim 14, wherein transferring a plurality of voltages to a memory and storing them in a plurality of storage devices of a data cache of the memory further comprises sequentially transferring a plurality of voltages to a memory and storing them in a plurality of storage devices of a data cache of the memory.

18. The method of claim 14, wherein further comprising adjusting a separate ground node coupled to each storage device of the data cache to compensate for non-uniform charge loss across the data cache wherein each ground node is coupled to a separate tap of one of a voltage divider, a resistive ladder, and a graduated resistance path of a leakage adjustment circuit.

19. A non-volatile memory, comprising:
a non-volatile memory array having a plurality of non-volatile memory cells;
a data cache having a plurality of storage devices; and
a charge leakage model;
wherein the non-volatile memory is adapted to compensate the plurality of storage devices of a data cache of the non-volatile memory at least partially based on an output of the charge leakage model by,
initiating the charge leakage model,
transferring a plurality of voltages to a memory and storing them in the plurality of storage devices of the data cache, and
compensating the plurality of storage devices for charge loss at least partially based on an output of the charge leakage model.

20. The non-volatile memory of claim 19, wherein the memory is adapted to initiate the charge leakage model by charging a reference capacitor or activating a timer.

21. The non-volatile memory of claim 19, wherein the memory is adapted to initiate the charge leakage model at one of the start of voltage transfer to the memory, the start of sequential voltage transfer to the memory, after transfer of voltages is complete.

22. The non-volatile memory of claim 19, wherein the plurality of storage devices each have an associated buffer amplifier.

23. A method of operating a memory, comprising:
initiating a memory operation;
initiating a charge leakage model;
transferring a plurality of voltages to a memory and storing them in a plurality of storage devices of a data cache of the memory; and
compensating the plurality of storage devices for charge loss at least partially based on an output of the charge leakage model while executing the memory operation in the memory.

24. The method of claim 23, wherein initiating a memory operation further comprises one of receiving an external memory command and internally initiating a memory operation in the memory.

25. The method of claim 23, wherein compensating the plurality of storage devices for charge loss at least partially based on an output of the charge leakage model while executing the memory operation in the memory further comprises compensating the plurality of storage devices for one of uniform charge loss, non-uniform charge loss, and voltage level based charge loss while executing the memory operation in the memory.

* * * * *